(12) United States Patent
Park

(10) Patent No.: US 8,460,952 B2
(45) Date of Patent: Jun. 11, 2013

(54) LIGHT EMITTING DIODE DEVICE, LIGHT EMITTING APPARATUS AND METHOD OF MANUFACTURING LIGHT EMITTING DIODE DEVICE

(75) Inventor: Jung Kyu Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 107 days.

(21) Appl. No.: 12/903,911

(22) Filed: Oct. 13, 2010

(65) Prior Publication Data

US 2011/0084300 A1   Apr. 14, 2011

(30) Foreign Application Priority Data

Oct. 13, 2009   (KR) .................. 10-2009-0097160

(51) Int. Cl.
*H01L 21/00*   (2006.01)

(52) U.S. Cl.
USPC .............................................. 438/28; 257/98

(58) Field of Classification Search
USPC ................... 257/98; 438/116, 25, 28
See application file for complete search history.

(56) References Cited

U.S. PATENT DOCUMENTS

| 2001/0016400 | A1 | 8/2001 | Lee |
| 2006/0012298 | A1* | 1/2006 | Lee et al. ............... 313/512 |
| 2008/0121911 | A1 | 5/2008 | Andrews et al. |
| 2008/0179611 | A1 | 7/2008 | Chitnis et al. |
| 2009/0057690 | A1 | 3/2009 | Chakraborty |
| 2009/0065790 | A1 | 3/2009 | Chitnis et al. |
| 2010/0105156 | A1* | 4/2010 | Chen et al. ............... 438/27 |

FOREIGN PATENT DOCUMENTS

| JP | 2003-258310 | 9/2003 |
| JP | 2003-258312 | 9/2003 |
| KR | 10-2006-0095271 A | 8/2006 |
| KR | 10-2009-0040770 A | 4/2009 |
| WO | WO 2009/003435 A1 | 1/2009 |

OTHER PUBLICATIONS

European Search Report issued in European Patent Application No. EP 10 18 7006, dated Jan. 13, 2011.
Chinese Office Action, and English translation thereof, issued in Chinese Patent Application No. 201010508578.X dated Aug. 1, 2012.
Chinese Office Action, w/ English translation thereof, issued in Chinese Patent Application No. CN 201010508578.X dated Apr. 15, 2013.

* cited by examiner

*Primary Examiner* — Shaun Campbell
(74) *Attorney, Agent, or Firm* — McDermott Will & Emery LLP

(57) ABSTRACT

Provided is a light emitting diode device. The light emitting diode device includes a light emitting diode chip having a first surface on which first and second electrodes are disposed, and a second surface opposing the first surface, a wavelength conversion portion including fluorescent substances and covering the first surface and side surfaces of the light emitting diode chip, wherein the side surfaces denote surfaces placed between the first and second surfaces, and first and second electricity connection portions each including a plating layer, respectively connected to the first and second electrodes, and exposed to the outside of the wavelength conversion portion. Accordingly, the light emitting diode device, capable of enhancing luminous efficiency and realizing uniform product characteristics in terms of the emission of white light, is provided. Further, a process for easily and efficiently manufacturing the above light emitting diode device is provided.

8 Claims, 5 Drawing Sheets

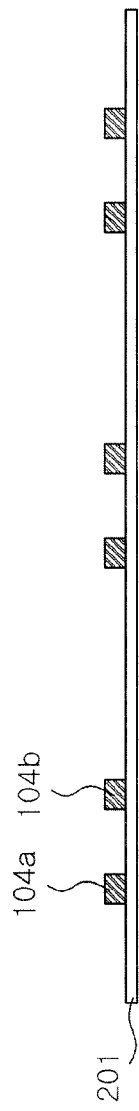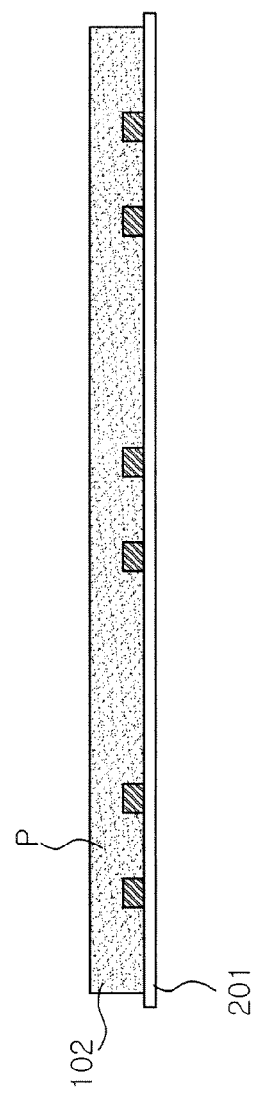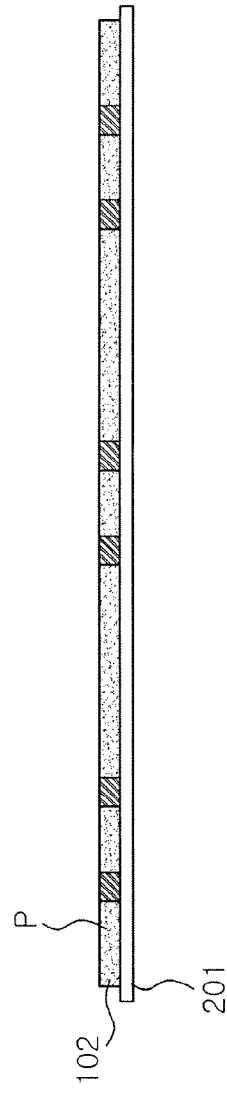

LIGHT EMITTING DIODE DEVICE, LIGHT EMITTING APPARATUS AND METHOD OF MANUFACTURING LIGHT EMITTING DIODE DEVICE

CROSS-REFERENCE TO RELATED APPLICATIONS

This application claims the priority of Korean Patent Application No. 10-2009-0097160 filed on Oct. 13, 2009, in the Korean Intellectual Property Office, the disclosure of which is incorporated herein by reference.

BACKGROUND OF THE INVENTION

1. Field of the Invention

The present invention relates to a light emitting diode device, a light emitting apparatus including a light emitting diode device, and a method of manufacturing a light emitting diode device, and more particularly, to a light emitting diode device that includes a light emitting diode chip coated with a fluorescent resin and is thus capable of emitting white light.

2. Description of the Related Art

Recently, light emitting diodes, employing nitride-based semiconductors, have been utilized as white light sources in various fields such as keypads, backlights, traffic lights, guiding lights for airplane runways, general lighting fixtures and the like. Due to this widespread use of light emitting diode chips, packaging technologies therefor are drawing attention.

FIG. 1 is a schematic cross-sectional view illustrating a light emitting diode package according to the related art. As for a lighting emitting diode package 10 with reference to FIG. 1, first and second lead frames 13 and 14 are disposed inside a package body 12, and a light emitting diode 11 is disposed on the first lead frame 13. The first and second lead frames 13 and 14 are electrically connected to the light emitting diode 11 by wires W. The package body 12 is provided in the form of a cup, and a resin portion 15 is placed in the cup so as to protect the light emitting diode 11, the wires W and the like. In order to emit white light, a fluorescent material, capable of converting the wavelength of light emitted from the light emitting diode 11, is dispersed within the resin portion 15.

However, the light emitting diode package 10, according to the related art, has limitations in that the process of curing the resin portion 15 may cause the fluorescent material to sink to the bottom of the cup. The fluorescent material, having sunk, is unable to effectively convert the wavelength of light and serves as light diffuser or light absorber, thereby degrading luminous efficiency.

Furthermore, the fluorescent material is distributed unevenly in spatial terms, resulting in undesirably wide variations in luminous efficiency and color temperature according to product.

SUMMARY OF THE INVENTION

An aspect of the present invention provides a light emitting diode device capable of improving luminous efficiency as compared to the related art light emitting diode packages, and realizing uniform product characteristics in terms of white light emissions. Another aspect of the present invention is to provide a method for facilitating the manufacturing of the above light emitting diode by using efficient processes.

According to an aspect of the present invention, there is provided a light emitting diode device including: a light emitting diode chip having a first surface on which first and second electrodes are disposed, and a second surface opposing the first surface; a wavelength conversion portion including fluorescent substances and covering the first surface and side surfaces of the light emitting diode chip, wherein the side surfaces refer to surfaces placed between the first and second surfaces; and first and second electricity connection portions each including a plating layer, respectively connected to the first and second electrodes, and exposed to the outside of the wavelength conversion portion.

The fluorescent substances may be provided only in a region of the wavelength conversion portion covering the first surface of the light emitting diode chip.

The fluorescent substances may be provided in a region of the wavelength conversion portion covering the entirety of the first surface and side surfaces of the light emitting diode chip.

The wavelength conversion portion may be absent on the second surface of the light emitting diode chip.

The fluorescent substances may be absent in a region of the wavelength conversion portion placed on the first surface of the light emitting diode chip and surrounding side surfaces of the first and second electrodes.

According to another aspect of the present invention, there is provided a light emitting apparatus including: a chip mounting portion including first and second conductors to thereby allow for the application of power thereto from the outside; a light emitting diode device including a light emitting diode chip having a first surface on which first and second electrodes are disposed, and a second surface opposing the first surface, a wavelength conversion portion including fluorescent substances and covering the first surface and side surfaces of the light emitting diode chip, wherein the side surfaces refer to surfaces placed between the first and second surfaces, and first and second electricity connection portions each including a plating layer, respectively connected to the first and second electrodes, and exposed to the outside of the wavelength conversion portion; and wires connecting the first and second electricity connection portions to the first and second conductors, respectively.

The light emitting diode device may be disposed to make the second surface faces the chip mounting portion.

The chip mounting portion may be a circuit board.

According to another aspect of the present invention, there is provided a method of manufacturing a light emitting diode device, the method including: preparing a fluorescent substrate including a body in which fluorescent substances are dispersed within a resin, and conductive vias penetrating the body; disposing a light emitting diode chip, having a first surface on which first and second electrodes are formed, and a second surface opposing the first surface, such that the first and second electrodes are connected to the conductive vias; and forming a resin portion to encapsulate at least side surfaces of the light emitting diode chip, wherein the side surfaces refer to surfaces placed between the first and second surfaces.

The conductive vias may each include a plating layer.

The disposing of the light emitting diode chip on the fluorescent substrate may be carried out so as to cause the first surface to face the fluorescent substrate.

The method may further include underfilling a region formed by the first and second electrodes between the light emitting diode chip and the fluorescent substrate, after the disposing of the light emitting diode chip on the fluorescent substrate.

In the underfilling, an underfill resin including fluorescent substances may be injected into the region.

The resin portion may include fluorescent substances.

The preparing of the fluorescent substrate may include: forming a pattern, having openings, on a carrier film; forming conductive vias in the openings; removing the pattern; and forming fluorescent resins around the conductive vias on the carrier film.

The method may further include removing the carrier film and exposing the conductive vias, after the forming of the resin portion.

BRIEF DESCRIPTION OF THE DRAWINGS

The above and other aspects, features and other advantages of the present invention will be more clearly understood from the following detailed description taken in conjunction with the accompanying drawings, in which:

FIGS. 4A through 9 are cross-sectional views for explaining a method of manufacturing a light emitting diode device according to an exemplary embodiment of the present invention.

DETAILED DESCRIPTION OF THE PREFERRED EMBODIMENT

Figure 1:
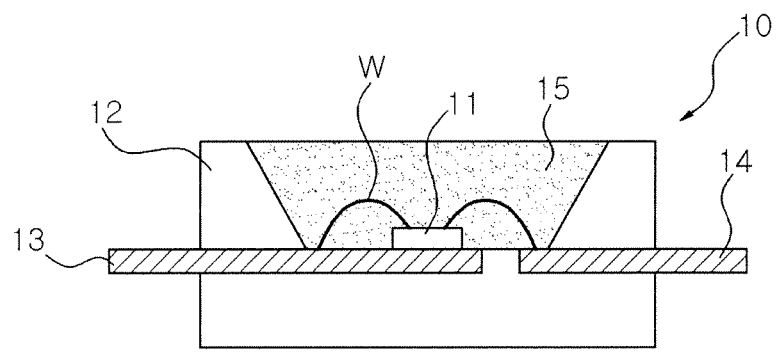
FIG. 1 is a schematic cross-sectional view illustrating a light emitting diode package according to the related art.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity. Like reference numerals in the drawings denote like elements, and thus their description will be omitted.

Figure 2:
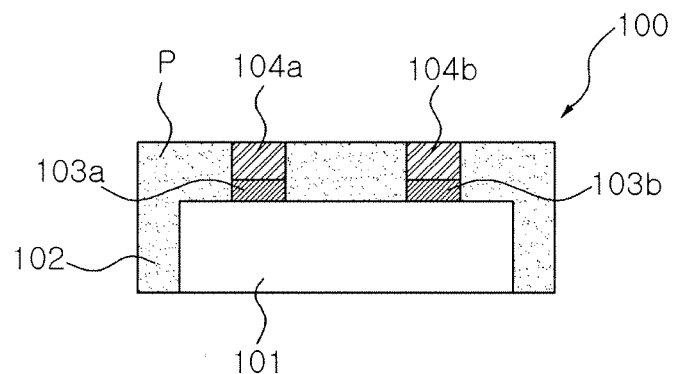
FIG. 2 is a schematic perspective view illustrating a light emitting diode device according to an exemplary embodiment of the present invention.

FIG. 2 is a schematic perspective view illustrating a light emitting diode device according to an exemplary embodiment of the present invention. Referring to FIG. 2, a light emitting diode device 100, according to this exemplary embodiment, includes a light emitting diode chip 101, and a wavelength conversion portion 102 covering the surface of the light emitting diode chip 101 and converting the wavelength of light emitted from the light emitting diode chip 101. To this end, the wavelength conversion portion 102 may be employed as a structure in which fluorescent substances P are dispersed in a transparent resin portion. The light emitting diode device 100 can emit white light as light converted by the wavelength conversion portion 102 is mixed with light emitted from the light emitting diode chip 101. The light emitting diode chip 101 may be configured by stacking an n-type semiconductor layer, a light emitting layer and a p-type semiconductor layer, and a first electrode 103a and a second electrode 103b are formed on one surface of the light emitting diode chip 101.

With reference to FIG. 2, the surface of the light emitting diode chip 101 on which the first and second electrodes 103a and 103b are placed is defined as a first surface, the surface opposing the first surface thereof is defined as a second surface, and the surfaces thereof placed between the first surface and the second surface are defined as side surfaces. In this regard, the wavelength conversion portion 102 may cover the first surface (i.e., an electrode formed surface) and side surfaces of the light emitting diode chip 101 as shown in FIG. 2. This is intended to emit light from the light emitting diode chip 101 in upward and sideward directions with reference to FIG. 2. According to this exemplary embodiment, the wavelength conversion portion 102 is provided in the form of a thin coating layer disposed along the surface of the light emitting diode chip 101, thereby achieving entirely uniform light as compared to the related art in which fluorescent substances are provided in the cup of a package body. Furthermore, the wavelength conversion portion 102 is applied directly to the surface of the light emitting diode chip 101 without employing a separate package body, thereby achieving a reduction in the size of a device.

For an electrical connection to the light emitting diode chip 101, this exemplary embodiment adopts first and second electricity connection portions 104a and 104b including plating layers, instead of lead frames. In detail, the first and second electricity connection portions 104a and 104b are configured to be connected to the first and second electrodes 103a and 103b, respectively. Each of the first and second electricity connection portions 104a and 104b includes a plating layer. The first and second electricity connection portions 104a and 104b are exposed to the outside through the wavelength conversion portion 102 so as to serve as a region for wire-bonding or the like. The light emitting diode device 100 has a simplified structure as compared to typical related art packages, and may be adopted for various types of light emitting apparatuses such as Chip On Board (COB) types or package types.

Figure 3:
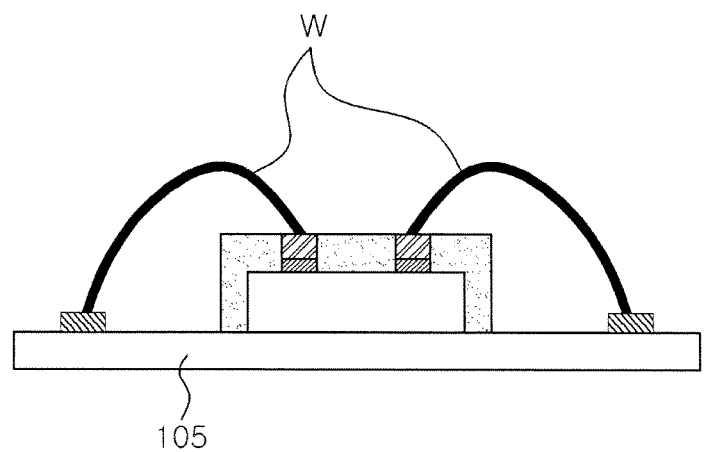
FIG. 3 is a schematic cross-sectional view illustrating a light emitting apparatus using the light emitting diode device depicted in FIG. 2.

FIG. 3 is a schematic cross-sectional view illustrating a light emitting apparatus using the light emitting diode device depicted in FIG. 2. With reference to FIG. 3, the light emitting apparatus may be implemented by mounting the light emitting diode device, configured as described above, on a board 105. Thus, a reference numeral indicating such a light emitting diode device is omitted in FIG. 3. The board 105 may utilize a circuit board having a circuit pattern formed on an insulating base, and wires are provided to connect the light emitting diode device with the circuit pattern. Considering that the light emitting diode device emits light through the first surface and the side surfaces of the light emitting diode chip as described above, the light emitting diode device is mounted such that the second surface of the light emitting diode chip faces the board 105. Even though only the mounting of the light emitting diode device with respect to the board 105 is illustrated in the drawing, the light emitting diode device may be mounted on a lead frame and thus provided for a typical package. If the light emitting diode device is provided as a package, there is no need to inject fluorescent substances into the cup of a package body, and uniform color temperature may be implemented in every light emission direction.

Hereinafter, a method of efficiently manufacturing the light emitting diode device configured as described above will be described. FIGS. 4A through 9 are cross-sectional views for sequentially explaining a method of manufacturing a light emitting diode device, according to an exemplary embodiment of the present invention.

First, a fluorescent substrate is prepared from a process of forming, in advance, first and second electricity connection portions of light emitting diode devices, and portions for constituting wavelength conversion portions of light emitting diode devices. Here, the fluorescent substrate refers to a substrate in which fluorescent substances are dispersed within a resin of an insulating body, and conductive vias penetrating the insulating body are provided therein. FIGS. 4A through 4C illustrate the process of preparing the fluorescent substrate. First, as shown in FIG. 4A, first and second electricity connection portions 104a and 104b, each of which includes a plating layer, are formed on a carrier film 201. To this end, the carrier film 201 may be subjected to a preceding process, although not shown in the drawing, which is associated with forming a seed layer on the carrier film 201 and forming a pattern with openings corresponding to the shape of the first and second electricity connection portions 104a and 104b. Through a subsequent process, the first and second electricity connection portions 104a and 104b may serve as conductive vias in the fluorescent substrate.

Thereafter, as shown in FIG. 4B, a resin containing fluorescent substances (i.e., a fluorescent resin) is formed on the carrier film 201, and this resin structure corresponds to the insulating body 102 of the fluorescent substrate. Furthermore, as described above, the fluorescent resin is cured to thereby form a wavelength conversion portion 102 in light emitting diode devices. Therefore, the insulating body and the wavelength conversion portion may be considered to be substantially the same (hereinafter, those two terms may be used interchangeably with each other). The fluorescent resin is formed around the first and second electricity connection portions 104a and 104b. In the case that the first and second electricity connection portions 104a and 104b are covered with the fluorescent resin as shown in FIG. 4B, there may be required a process of exposing the first and second electricity connection portions 104a and 104b to the outside by partially removing the fluorescent resin through grinding or the like. In this case, the process of removing the fluorescent resin, shown in FIG. 4C, may also be performed in such a manner as to precisely control the color coordinates of light emitted from light emitting diode devices. The exposed regions of the first and second electricity connection portions 104a and 104b may be provided as wire bonding regions in the final light emitting diode devices.

The fluorescent substrate can be easily prepared because the processes of preparing the fluorescent substrate described above with reference to FIGS. 4A through 4C are similar to the typical process of manufacturing a printed circuit board, except that the insulating body is formed of the fluorescent resin. Also, the insulating body of the fluorescent substrate, formed in the above manner, constitutes a wavelength conversion portion 102, and may be controlled appropriately in terms of the thickness thereof or the content of fluorescent substances according to the previously measured wavelength or flux of a light emitting diode chip. Thus, the wavelength conversion portion may be adopted after being suitably adjusted according to various characteristics of light emitting diode chips. Thus, variations in color coordinates can be minimized in final light emitting diode devices.

Figure 5:
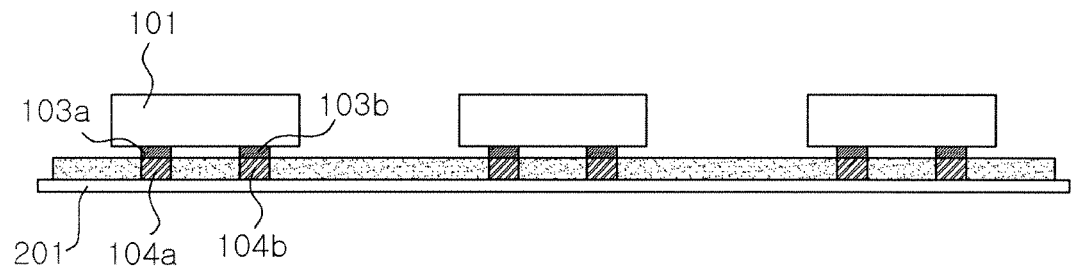

Subsequently, as shown in FIG. 5, light emitting diode chips 101 are disposed on the fluorescent substrate. In detail, first and second electrodes 103a and 103b disposed on one surface of each of the light emitting diode chips 101 are respectively connected with the first and second electricity connection portions 104a and 104b exposed on the fluorescent substrate. To this end, printed solders, solder balls, solder bumps or the like, although not shown in the drawing, may be formed between the first and second electrodes 103a and 103b and the first and second electricity connection portions 104a and 104b.

Figure 6A:
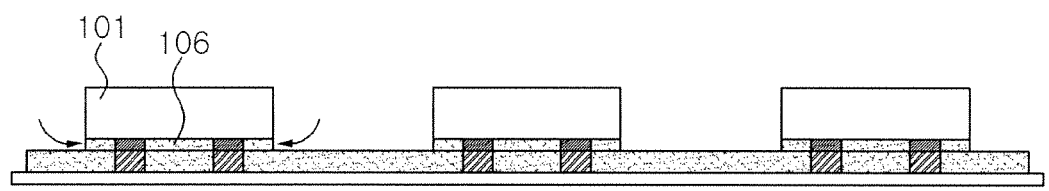
Figure 6B:
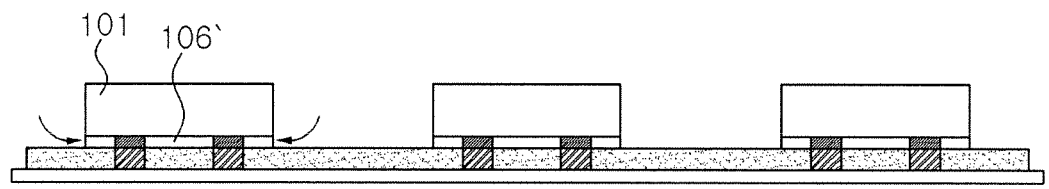

Subsequently, as shown in FIG. 6A, underfilling is carried out upon the space between the light emitting diode chips 101 and the fluorescent substrate so as to form underfill resin portions 106. The underfill resin portions 106 may constitute a wavelength conversion portion in light emitting diode devices, and may have a structure in which fluorescent substances are dispersed within a transparent resin, as in the insulating body of the fluorescent substrate. Alternatively, as shown in FIG. 6B, underfill resin portions 106' may be formed only of a transparent resin without fluorescent substances. However, the underfill process described herein is not necessarily required, and the space between the light emitting diode chips 101 and the fluorescent substrate may be filled with resin in the subsequent process of forming a resin portion.

Figure 7A:
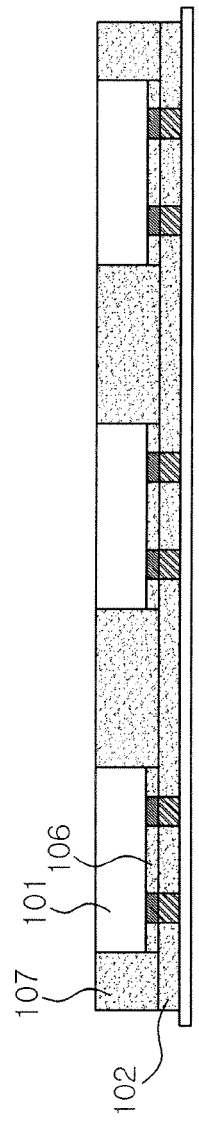
Figure 7B:
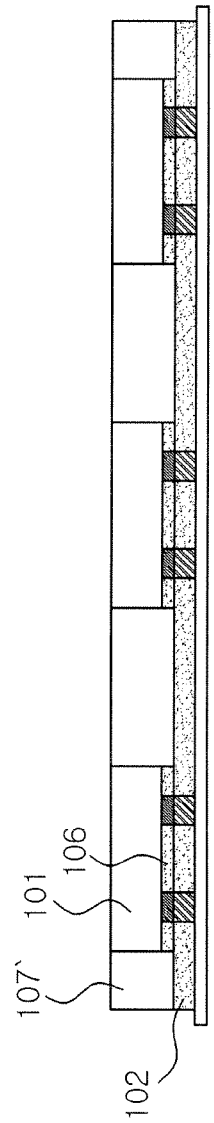

Thereafter, as shown in FIG. 7A, a resin portion 107 is formed to encapsulate the side surfaces of the light emitting diode chips 101. Like the insulating body of the fluorescent body, namely, the wavelength conversion portion 102, and the underfill resin portions 106, the resin portion 107 may have a structure in which fluorescent substances are dispersed within a transparent resin. However, as shown in FIG. 7B, the resin portion 107 may be formed only of a transparent resin without fluorescent substances, considering that light emitted from the side surfaces of the light emitting diode chips 101 has a lower level of intensity than light emitted from the first surfaces.

Figure 8:
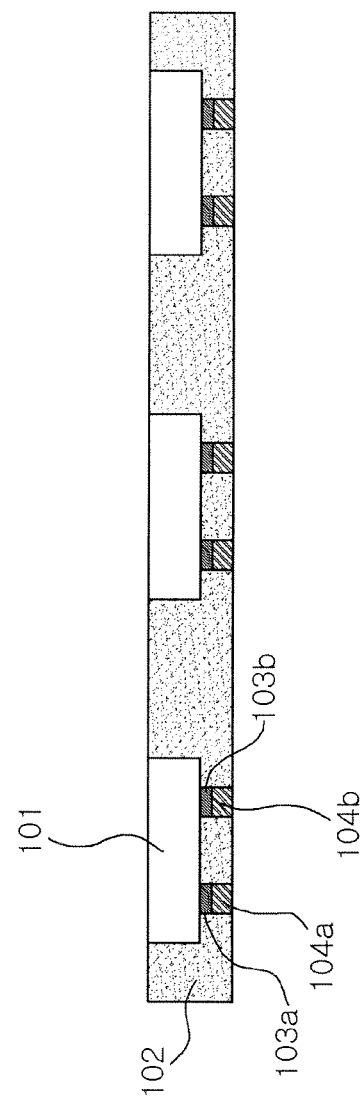
Figure 9:
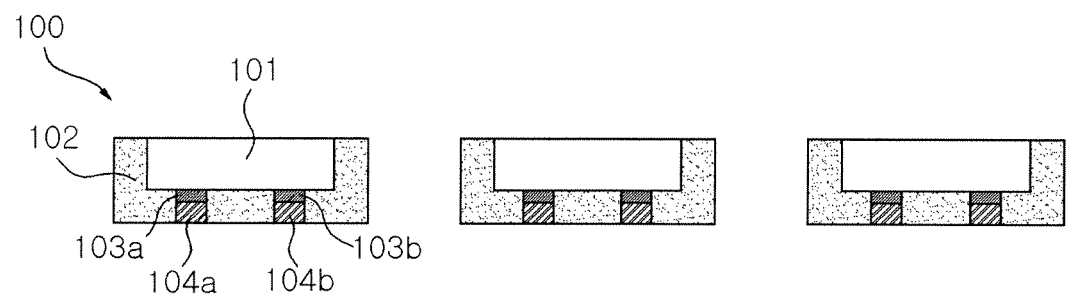

Thereafter, as shown in FIG. 8, the carrier film 201 is removed to thereby expose the first and second electricity connection portions 104a and 104b. In FIG. 8, the body of the fluorescent substrate, the underfill resin portions 106 and the resin portion 107, which may be considered to have the same configuration as described above, are illustrated as if forming a single wavelength conversion portion 102. Subsequently, as shown in FIG. 9, the single wavelength conversion portion 102 connecting a plurality of light emitting diode devices 100 are diced into separate devices. In the case in which lighting emitting diode devices 100 are manufactured individually, this present process is not required. However, this process may facilitate the manufacturing of a plurality of light emitting diode devices 100 as a plurality of light emitting diode chips 101 are mounted on a fluorescent substrate.

Figure 10:
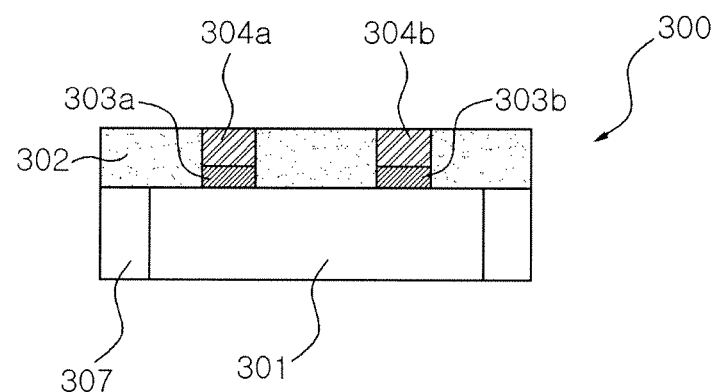
FIGS. 10 and 11 are schematic perspective views illustrating a light emitting diode device according to another exemplary embodiment of the present invention.
Figure 11:
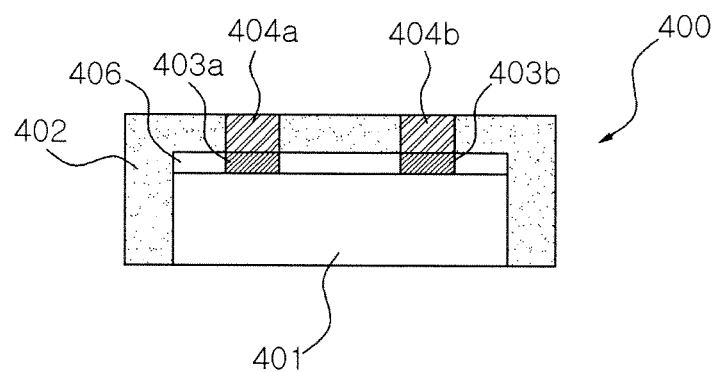

FIGS. 10 and 11 are schematic perspective views illustrating light emitting diode devices according to other exemplary embodiments of the present invention, respectively. Referring to FIG. 10, a light emitting diode device 300 includes, as in the previous embodiment, a light emitting diode chip 301 having first and second electrodes 303a and 303b, a wavelength conversion portion 302, and first and second electricity connection portions 304a and 304b. The difference thereof from the structure depicted in FIG. 2 is that a resin portion, disposed on the side surfaces of the light emitting diode chip 301, is formed of a transparent resin without fluorescent substances. The light emitting diode device 300 having the above structure may be obtained by using the process depicted in FIG. 7B.

Thereafter, a light emitting diode device 400 shown in FIG. 11 includes, as in the previous embodiment, a light emitting diode chip 401 having first and second electrodes 403a and 403b, a wavelength conversion portion 402, and first and second electricity connection portions 404a and 404b. The difference thereof from the structure depicted in FIG. 2 is that an underfill resin portion 406 placed on the first surface of the light emitting diode chip 401 and surrounding the side surfaces of the first and second electrodes 403a and 403b is formed of a transparent resin without fluorescent substances.

The light emitting diode device 400 having the above structure may be obtained by using the process depicted in FIG. 6B.

As set forth above, according to exemplary embodiments of the invention, a light emitting diode device, capable of enhancing luminous efficiency and realizing uniform product characteristics in terms of the emission of white light, is provided. Besides, the process for easily and efficiently manufacturing the above light emitting diode device is provided.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a light emitting diode device, the method comprising:
    preparing a fluorescent substrate including a body in which fluorescent substances are dispersed within a resin, and conductive vias penetrating the body;
    after the preparing of the fluorescent substrate, disposing a light emitting diode chip having a first surface and a second surface opposing the first surface, and forming first and second electrodes on the first surface, such that the first and second electrodes are connected to the conductive vias; and
    after the disposing of the light emitting diode chip and the forming of the first and second electrodes, forming a resin portion to encapsulate at least side surfaces of the light emitting diode chip,
    wherein the side surfaces are placed between the first and second surfaces.

2. The method of claim 1, wherein each of the conductive vias includes a plating layer.

3. The method of claim 1, wherein the disposing of the light emitting diode chip on the fluorescent substrate is carried out so as to cause the first surface to face the fluorescent substrate.

4. A method of manufacturing a light emitting diode device, the method comprising:
    preparing a fluorescent substrate including a body in which fluorescent substrates are dispersed within a resin, and conductive vias penetrating the body;
    disposing a light emitting diode chip, having a first surface on which first and second electrodes are formed, and a second surface opposing the first surface, such that the first and second electrodes are connected to the conductive vias;
    underfilling a region formed by the first and second electrodes between the light emitting diode chip and the fluorescent substrate, after the disposing of the light emitting diode chip on the fluorescent substrate; and
    forming a resin portion to encapsulate at least side surfaces of the light emitting diode chip, wherein the side surfaces refer to surfaces placed between the first and second surfaces.

5. The method of claim 4, wherein, in the underfilling, an underfill resin including fluorescent substances is injected into the region.

6. The method of claim 1, wherein the resin portion includes fluorescent substances.

7. A method of manufacturing a light emitting diode device, the method comprising:
    preparing a fluorescent substrate including a body in which fluorescent substrates are dispersed within a resin, and conductive vias penetrating the body;
    disposing a light emitting diode chip, having a first surface on which first and second electrodes are formed, and a second surface opposing the first surface, such that the first and second electrodes are connected to the conductive vias; and
    forming a resin portion to encapsulate at least side surfaces of the light emitting diode chip, wherein the side surfaces refer to surfaces placed between the first and second surfaces, wherein the preparing of the fluorescent substrate comprises:
    forming a pattern, having openings, on a carrier film;
    forming conductive vias in the openings;
    removing the pattern; and
    forming fluorescent resins around the conductive vias on the carrier film.

8. The method of claim 7, further comprising:
    after the forming of the resin portion, removing the carrier film and exposing the conductive vias.

* * * * *